United States Patent [19]

Yoshida et al.

[11] 4,057,660
[45] Nov. 8, 1977

[54] METHOD FOR PRODUCING THERMOPLASTIC FILM ELECTRIC ELEMENT

[75] Inventors: Masafumi Yoshida; Tohru Sasaki; Shuji Terasaki, all of Iwaki, Japan

[73] Assignee: Kureha Kagaku Kogyo Kabushiki Kaisha, Tokyo, Japan

[21] Appl. No.: 608,612

[22] Filed: Aug. 28, 1975

[30] Foreign Application Priority Data

Sept. 3, 1974   Japan .................................. 49-100506

[51] Int. Cl.² .............................................. B05D 5/12
[52] U.S. Cl. ...................................... 427/100; 427/123; 427/264; 427/271
[58] Field of Search ............... 427/100, 124, 123, 258, 427/264, 271; 156/3, 7, 18

[56] References Cited

U.S. PATENT DOCUMENTS

| | | |
|---|---|---|
| 3,912,830 | 10/1975 | Murayama et al. .................. 427/122 |
| 3,931,420 | 1/1976 | Schulz et al. ......................... 427/258 |
| 3,931,446 | 1/1976 | Murayama et al. .................. 427/100 |

*Primary Examiner*—Cameron K. Weiffenbach
*Attorney, Agent, or Firm*—Sughrue, Rothwell, Mion, Zinn and Macpeak

[57] ABSTRACT

Separate polarizing electrodes are attached to the opposite surfaces of a thermoplastic film. A high D. C. voltage is then applied across these electrodes to polarize the film to produce an electric element, such as an electret, piezoelectric or pyroelectric element. Portions of the polarizing electrodes are then selectively removed to form the operating electrodes required for the electric element.

9 Claims, 1 Drawing Figure

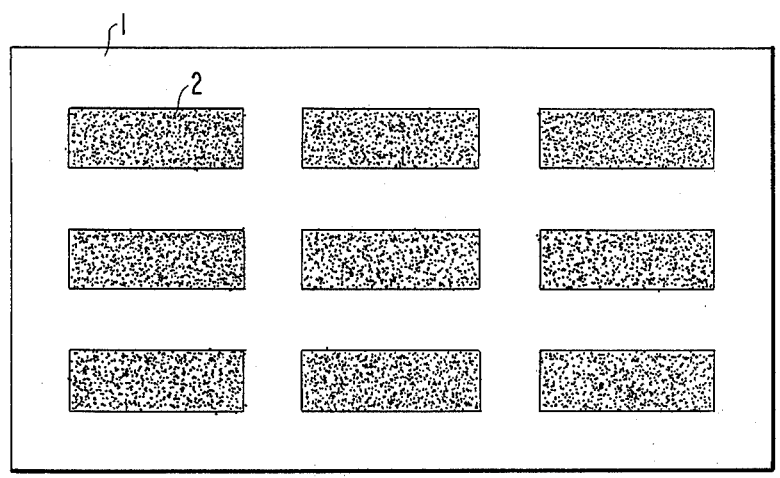

METHOD FOR PRODUCING THERMOPLASTIC FILM ELECTRIC ELEMENT

BACKGROUND OF THE INVENTION

1. Field of the Invention

This invention relates to a method for producing a thermoplastic electric element by attaching electrodes on required parts of the surfaces of a thermoplastic film which has been polarized to acquire piezoelectricity, pyroelectricity, or a semipermanent external electric field.

2. Description of the Prior Art

It has been widely known that, when a thermoplastic formed substance is polarized by applying a D.C. high electric field under a polarizing temperature, the electrical properties of the formed substance are very much different from those of the original substance. The first observable variation in electrical property of the polarized substance is that the substance has surface electric charges. More specifically, the thermoplastic formed substance, just after the polarization, exhibits extremely high surface electric charges even after the removal of the electric field, thus presenting an external electric field. Although the external electric field tends to decrease when the formed substance is heated or left as it is for a considerable period, or sometimes tends to exhibit a polarity opposite to that just after the polarization, some kinds of thermoplastic substances retain surface electric charges of extremely stable nature after disappearance of unstable surface electric charges, and therefore exhibit a semi-permanent stable external electric field. Those having such stable external electric field are generally called electrets. As for the thermoplastic substances which can produce electrets, there are polytetrafluoroethylene, polystyrene, polycarbonate, tetrafluoroethylene-ethylene copolymer, polyethylene, polypropylene, a mixture of polyvinylidene fluoride and methylmethacrylate, and the like.

Another variation in electrical properites of the formed substance is the appearance of piezoelectricity or pyroelectricity. For instance, polarization of some polar thermoplastic substances such as polyvinylidene fluoride, polyvinyl fluoride, and polyvinyl chloride can frequently produce substances having extremely high piezoelectricity or pyroelectricity.

The piezoelectricity and pyroelectricity are considered to be properties caused by latent polarization internally of the polar thermoplastic substances, while the electret is considered to be caused by distinct polarization thereof. For this reason, broadly all of these properties are frequently called electret phenomena, although some people oppose such denomination because stable piezoelectricity and pyroelectricity sometimes appear after the disappearance of the surface electric charges.

The present invention is related to a method for producing electrical elements obtained by attaching electrodes to a polarized thermoplastic film which exhibits the "electret" property in the broader meaning inclusive of the above-described three properties. However, the term "electret" will be used hereinbelow in its narrow meaning to designate those elements having stable surface electric charges.

Various applications, such as the diaphragm in an electroacoustic transducer, elements for oscillation measuring purposes, piezoelectric switches, and the like have been considered for utilizing the piezoelectricity of a thermoplastic film, and in U.S. Pat. Application 506,814, now U.S. Pat. No. 3,935,485, (B. Patent Application 40566/74), there has been proposed a co-ordinate input device having a plurality of piezoelectric conversion elements provided on a sheet of piezoelectric thermoplastic film. For instance, when the input ordinate of this input device is composed of a plurality of switches, a keyboard switch can be obtained, and when a plurality of thermoplastic piezoelectric elements acting as a plurality of input co-ordinates are attached on an oscillating body, oscillations at various positions can be measured thereby indicating a distribution of the oscillation.

As for the application utilizing the pyroelectricity of a thermoplastic film, various fields relating to a detector for infrared rays, a measuring unit for temperature variation, a fire-alarm device, a pyroelectric switch, and the like are considered. An application thereof as a co-ordinate input device also has been proposed in U.S. Pat. No. 3,772,518 or British Pat. No. 1,355,783.

On the surfaces of the piezoelectric or pyroelectric thermoplastic films to be used in the co-ordinate input devices, electrodes are provided on both surfaces thereof for collecting electric charges generated on the surfaces by the piezoelectric or pyroelectric conversion, and for supplying signals related to the electric field to respective electric circuits. The electrodes to be provided on one surface of the film are formed as a plurality of separate lines or spots so that the input co-ordinates are electrically isolated from each other. On the other hand, the electrodes to be provided on the other surface of the film may be formed as a single continuous electrode to be grounded or as a separate lines or spots provided at the opposite positions to the above-mentioned signal generating electrodes. Otherwise, the electrodes on the two surfaces of the film may be formed as lines extended in different directions, and intersecting positions of these groups of lines, one being on the front surface and the other being on the rear surface, may be used as separate co-ordinate inputs. In any one of the above-described cases, electrodes on at least one surface of the piezoelectric or pyroelectric thermoplastic film, which are to be used as co-ordinate inputs, must be attached to the surface in a discontinuous manner at separate positions on the surface.

In another mode of application of the electret film utilizing the surface electric charges, the outer electric field of the electret is used as a bias voltage of a capacitor, and the variation in the capacitance of the capacitor is employed for various purposes. A capacitor type microphone utilizing this principle is already available on the market. As another application of an electret film, there are various switching elements, and a type of keyboard switches utilizing this principle has been proposed in, for instance, U.S. Pat. No. 3,668,417.

When the external electric field of an electret film is used as a bias voltage of a capacitor, the surface of the electret facing the opposing electrode of the capacitor, and which presents the external electric field, should be kept bare without having any electrode, and the other surface of the electret is provided with an electrode connected to an electric circuit. In the case of the keyboard switches, the other surface of the electret may be provided with spot-like non-continuous electrodes.

Thus, it is apparent that in the application as an electret film, only one surface of the electret film should be provided with a single electrode covering the entire surface or a plurality of separate electrodes discontinuous with each other.

An example wherein the piezoelectricity and surface electric charges of an electret also having a piezoelectric property are both utilized has been proposed in the Japanese Patent Application No. 115190/1973, and in this case also the electrode must be provided on one surface only of the electret film.

Summarizing the above description, when a polarized thermoplastic film having electret, piezoelectric, or pyroelectric property is used for producing electric elements, the electrode or electrodes are provided on one surface of the thermoplastic film, or else in the form of lines or spots of a discontinuous nature on both surfaces of the thermoplastic film.

The polarization of the thermoplastic film is realized by inserting the film between two electrodes and applying a D. C. electric field across the electrodes with the film maintained at a polarizing temperature. In this case, if other polarizing conditions remain the same, a polarizing film having a high concentration of surface electric charges, or a higher degree of piezoelectricity or pyroelectricity, can be ordinarily obtained when the intensity of the applied electric field is higher. The temperature for the polarization is preferably selected at a higher value so long as the nature of the thermoplastic film (such as crystalization and form of the crystals, particularly when the aim is to produce piezoelectricity and pyroelectricity) is not changed widely. However, since the insulating resistance of the film is lowered at higher temperatures, an optimum value of temperature should be selected in relation to the electric field applied thereto. An advantageous result is obtained when a high field, near the break-down voltage, is applied to the thermoplastic film at a predetermined polarizing temperature. At the time of the polarization, if the electrodes are not attached tightly onto the film, an air-gap might exist between the electrodes and the film, and corona discharge tends to occur in the air-gap because the break-down voltage in air is lower than that of the plastic, and pin holes are frequently created through the thin film. Furthermore, electric conductivity in the thin film is ordinarily increased in accordance with the elevation of the temperature, and when the conductivity in the thin film exceeds that of the air-gap, a voltage higher than the intensity of the applied electric field (KV/cm) is created in a concentrated manner in the air-gap, thereby accelerating the occurrence of the corona discharge in the air-gap. Once the corona discharge occurs, the electric resistance in the air gap decreases, and since the energy of the corona discharge is not so high, the occurrence of the corona discharge does not constitute any serious problem when the thickness of the film is sufficiently great. However, if the film is quite thin, and when such a thin film is polarized at a high temperature under a high voltage, the occurrence of the corona discharge sometimes poses a serious problem. In order to obviate such a difficulty, the thermoplastic film must be polarized under a relatively low voltage, and therefore a satisfactory polarization of the thin film cannot be attained. In the case where no break-down due to discharge occurs, the presence of the air gap lowers the applied voltage, and the polarization thereby obtained becomes irregular.

At the time of the production of elements, each having electrodes on both surfaces of the film with each of the electrodes covering the substantial part of the surface except peripheral portions thereof, the polarization of the thermoplastic film can be effectuated with use being made of these electrodes without any accompanying possibility of discharges due to the air gap or of producing uneven polarization due to discharges. However, when it is desired to produce an element having a single electrode on one surface thereof or a plurality of electrodes of discontinuous configurations on both surfaces of the film, it has been a common practice to provide a separate electrode or electrodes over the surface having no electrode or the surfaces having the discontinuous electrodes, and to polarize the thermoplastic film through the single separate electrode or plurality of separate electrodes. In the latter case, however, the above-described trouble due to the discharges occurs. Furthermore, it may also be considered that the film having a plurality of discontinuous electrodes be polarized by respectively connecting these electrodes with the voltage source. However, such a procedure is extremely troublesome and is not suitable for the production of such electric elements on an industrial scale.

SUMMARY OF THE INVENTION

The present invention is directed to the elimination of the above described difficulties in producing electrical elements by partially attaching electrodes onto the surface or surfaces of a thermoplastic film and polarizing the film.

BRIEF DESCRIPTION OF THE DRAWING

The FIGURE is a plan view showing an example of a thermoplastic film electric element produced in accordance with the invention.

DETAILED DESCRIPTION OF THE PREFERRED EMBODIMENT

According to the present invention, electrically conductive thin layers are first deposited almost entirely on both surfaces of a thermoplastic film. Then, using the electrically conductive thin layers as two electrodes, a high voltage electric field is applied across the thermoplastic film thereby polarizing the same film, and the electrically conductive thin layers deposited on the surfaces of the thus polarized thermoplastic film are then partly removed so that only the parts of the electrodes required for the electrical elements to be produced are left on the surfaces; or the electrically conductive thin layers are partly removed as described above, and discrete, i.e., non-continuous, electrically conductive layer fractions are again deposited at least on some of the removed parts to provide the required electrodes for the electrical elements to be produced.

In the above-described method for producing electrical elements from a polarized thermoplastic film, if the electrically conductive thin layers first deposited on both surfaces of the film are extended over the entire surfaces of the film, electric discharge tends to occur along the peripheral part of the film due to the high voltage of the polarization. To obviate this difficulty, marginal areas having no thin layers, of several millimeter widths, must be provided on one or both surfaces of the film. In addition, the film having electrically conductive layers deposited on both surfaces form a capacitor whose capacity is increased in proportion to the areas of the electrically conductive layers.

In the case where a thermoplastic film is polarized by the application of an electric field of an intensity in the neighborhood of the breakdown voltage, pin-holes tend to be created due to partial break-down in the areas having thinner thicknesses or containing electrically conductive impurities. Thus, if the capacity of the capacitor is great, electric energy stored between the thin layers is instantaneously discharged through the breakdown areas thereby enlarging the pin holes and evaporating the electrically conductive thin layers nearby the pin holes.

Furthermore, when the thermoplastic film is polarized by a method wherein, for instance, a long film having electrically conductive layers attached on both surfaces thereof is continuously pulled out of a roll and passed through a polarizing zone where a high voltage electric field is applied at a polarizing temperature, and then wound in the form of another roll, if the electrically conductive layers on both sides of the film are respectively continuous throughout the entire length, the high voltage will be applied to the entire film ranging from a part contained in the supply roll to a part contained in the winding roll, such a feature being extremely dangerous for operators. For obviating the dangerous condition, the electrically conductive layer at least on one side of the film is interrupted at positions so that the layer is divided into suitable lengths by regions having no such layer. In the case where the thermoplastic film is broad in width, the above-mentioned insulating regions are advantageously provided in the direction of the width.

It should be noted that although a long film having electrically conductive layers not entirely covering the film is used at the time of the polarization, the electric elements are manufactured from a sheet of film having electrically conductive layers on the entire surfaces thereof except for marginal regions on the periphery.

As for electrically conductive substances adapted to be deposited on the film, electrically conductive elements such as gold, platinum, silver, copper, iron, tin, zinc, aluminum, nickel, chromium, carbon, and the like, mixtures of these elements, or printing inks of electrically conductive nature can be used. These may be attached on the surfaces through various methods such as plating, vapor deposition, sputtering, and printing. However, vapor deposition is most advantageous because it does not necessitate water or organic solvent, a slight amount of which, when it remains, tends to lower the break-down voltage of the film, and a troublesome drying procedure is also eliminated by the deposition method.

The electrically conductive substance to be attached to the film is not necessarily of one kind; for instance, one layer of gold may be vapor-deposited discontinuously on a surface, and then aluminum may be vapor-deposited entirely over the thus gold-deposited surface of the film. In this case, the aluminum layer is removed by dissolving aluminum with caustic soda after the polarization of the film, whereby a film having discontinuous gold electrodes can be obtained.

The polarization may be carried out on individual sheets cut to a suitable size from a large size film having electrodes on both surfaces thereof, or, as disclosed in U.S. Pat. application No. 489,326, now U.S. Pat. No. 3,943,614, or British Pat. Application No. 31545/74, by winding a long film having electrodes into a roll in such a manner that electrodes charged to different polarities at the time of polarization are not brought into contact with each other (for instance, by winding two plies of the films into a roll and applying a high voltage across two groups of electrodes, one being those on the interfaces, and the other being those on the outer sides of the two plies). Alternatively, the polarization may be carried out by applying a high voltage across two electrodes on both surfaces of a long continuous film and passing successively through a region heated to a polarizing temperature. However, it is apparent that the polarization may also be realized by any of other suitable procedures.

In order to remove electrodes used for polarizing the film, if the electrodes are made in the form of electrically conductive thin layers by vapor-deposition or plating, it will be sufficient to merely wipe the electrode surfaces with a piece of cloth or the like. But they may be more easily removed by wiping with use being made of a liquid such as methanol, ether, and the like which can easily wet the electrodes. Otherwise, the electrodes can be removed by solvents which dissolve the material of the electrodes. If the electrodes are made of aluminum, zinc, or the like, they may be easily removed by caustic soda or a dilute water solution of chloric acid; and, if the electrodes are made of gold, the electrodes can be removed by using an alkali cyanate water solution.

When it is desired to partially remove the electrodes from the surfaces of the film, the part to be removed is subjected to the hand wiping or to the removing agent; or else the part to be left is covered by a protecting film which can resist the removing agent, and only the part not covered by the protecting film is subjected to the agent. Otherwise, the electrodes may be beforehand provided with two kinds of metals, and one of the metals may be dissolved and removed as described hereinbefore.

However, the procedure whereby only part of the polarizing electrodes entirely covering the film surfaces are removed, is ordinarily troublesome, and sometimes more of the electrodes is removed than is required, thus frequently causing an undesired loss of the electrode material. It is thus found preferable to use a method wherein electrodes on the surfaces, on which discrete, i.e., non-continuous, electrodes are to be attached, are first entirely removed, and the discrete electrodes are thereafter attached on the surfaces. According to this method, the electrodes to be newly attached thereon may be many in number or may have complex configurations from which many fine lead wires are led out.

The attachment of the discrete final operating electrodes on the part of the film, from where the polarizing electrodes have been removed, can be carried out through various procedures described above. When the attachment is carried out by a surface printing method utilizing an electrically conductive ink, any complex electrode pattern can be obtained in a simple manner. Since it is not necessary to consider the application of a high voltage as in the case of the polarizing electrodes, the surface printing method is preferable for the attachment of the discrete electrodes. However, for the purpose of producing film element to be used for a vibration diaphragm in an acoustic apparatus, plating or vapor-deposition is advantageously used for reducing the mass of the film element.

As for the thermoplastic film to be used in the present invention, there are various kinds made of thermo-plastic resins such as polyethylene, polypropylene, polystyrene, polyacrylonitrile, ethylpolymethacrylate, ethylpolyacrylate, polyvinyl chloride, polyvinylidene chloride, polyvinyl fluoride, polyvinylidene fluoride, polytrifluoroethylene, polytrifluorochloroethylene, polytetrafluoroethylene, polyamide, polyester, polycarbonate, copolymer of vinyl chloride and vinylidene chloride, copolymer of ethylene and tetrafluoroethylene, copolymer of ethylene and vinylidene fluoride, copolymer of vinylidene fluoride and tetrafluoroethylene, copolymer of vinylidene fluoride and vinylfluoride, copolymer of vinylidene fluoride and trifluoromonochloroethylene and the like, and the present invention can be applied when electrets, piezoelectric elements, and pyroelectric elements are produced from a thermoplastic film employing the above described substances. Particularly when polyvinylidene fluoride or a copolymer mainly comprising vinylidene fluoride is used for the film, the electric conductivity thereof at a high temperature during polarization greatly increases to a value several tens of times or several thousands of times greater than the ordinary value. Thus, when an air gap is created as described hereinbefore, extremely high voltage tends to accumulate in the air gap thereby causing electric discharge. For this reason, the present invention is extremely useful for producing piezoelectric elements or pyroelectric elements by polarizing the polyvinylidene fluoride copolymer mainly comprising vinylidene fluoride, polyvinyl fluoride, and the like formed into a film or a sheet.

EXAMPLE

A polyvinylidene fluoride film of 8 microns in thickness and 150 mm in width was prepared by elongating the film along one axis (at a temperature of 80° C and an elongation rate of four times the original length). Almost entirely on both surfaces (leaving marginal areas along the two lateral edges on one surface of the film and selecting the width of the marginal areas as 10 mm), aluminum was vapor-deposited. From the thus obtained long film having the vapor-deposited layers, pieces each having about 10 mm in length were cut, and marginal areas also having a width of 10 mm measured along the length of the film were provided along the forward and backward edges of the film on the surface thereof (having the two lateral marginal areas). The forward and backward marginal areas were provided for instance by wiping the parts with 1 N caustic soda water. The film was then folded back in an overlapping manner so that the two ends thereof were placed together, and then wound on a roll having a diameter of 100 mm. The aluminum deposited layers were connected to a D.C. voltage source so that the interface layers between the two parts of the film were connected with the positive terminal and the outerface layers on the two parts of the film were connected with the negative terminal of the voltage source. The polarization was carried out with the application of 640 V (800 KV/cm) in an air bath at 110° C for 30 minutes. After the 30 minutes, the temperature of the bath was lowered, and the voltage was removed when the temperature was reduced below 50° C.

The film thus polarized was found to contain absolutely no pin hole, and the piezoelectricity $d_{31}$ was $7 \times 10^{-7}$ c.g.s.e.s.u., and the pyroelectricity (a stable value obtained at 50° C after repeating elevation and descension of the temperature in a range of from a normal temperature to 60° C) was $6 \times 10^{-9}$ coulomb/° Ccm.

Pieces each having a rectangular form of $7 \times 9$ cm were cut from the film thus polarized, and the vapor-deposited layer on one surface of the piece was removed at an interval of 1 cm for the longitudinal direction and at the central part and both side parts with 0.5 N caustic soda solution. The film was then water-washed to produce an electric element 1 as shown in FIG. 1 having electrodes 2 distributed in a spot-like manner on one surface of the element, and each of the electrodes being 1 cm in width and 3 cm in length, and the other surface being vapor-deposited entirely. From this film element, specimens consisting of parts having electrodes on both sides thereof were cut, and piezoelectricity and pyroelectricity were measured. The results were quite similar to those described above.

We claim:

1. A method for producing a thermoplastic film electric element comprising the steps of:
   attaching electrically conductive thin layers on both surfaces of a thermoplastic film, respectively;
   applying a D.C. electric field across the electrically conductive thin layers to polarize the film, then removing at least a part of the electrically conductive thin layers, and thereafter attaching a plurality of non-continuous, electrically conductive, thin-layer, operating electrodes on the film surfaces from which the part of the electrically conductive thin layers has been removed.

2. A method for producing a thermoplastic film element according to claim 1, wherein the produced film electric element is a piezoelectric or a pyroelectric element.

3. A method for producing a thermoplastic film element according to claim 1, wherein the thermoplastic film is either polyvinylidene fluoride or a copolymer consisting mainly of vinylidene fluoride.

4. A method for producing a thermoplastic film electric element comprising the steps of:
   attaching electrically conductive thin layers on both surfaces of a thermoplastic film respectively;
   applying a D.C. electric field across the electrically conductive thin layers to polarize the film; and
   then forming operating electrodes on the element by removing a part of the electrically conductive thin layer on at least one surface of the film by dissolving said part in a solvent.

5. A method for producing a thermoplastic film element according to claim 4, wherein the produced film electric element is a piezoelectric or a pyroelectric element.

6. A method for producing a thermoplastic film element according to claim 4, wherein the thermoplastic film is either polyvinylidene fluoride or a copolymer consisting mainly of vinylidene fluoride.

7. A method for producing a thermoplastic film element according to claim 4, wherein said attaching step comprises forming at least one of said electrically conductive thin layers as a non-continuous metallic sub-layer on the film and a continuous metallic top layer overlying the sub-layer and of a different kind of metal from that of said sub-layer and covering the film; and wherein said removing step comprises dissolving only said continuous layer by using a solvent which can dissolve said continuous layer but not said non-continuous layer.

8. A method for producing a thermoplastic film element according to claim 7, wherein the produced film electric element is a piezoelectric or a pyroelectric element.

9. A method for producing a thermoplastic film element according to claim 7, wherein the thermoplastic film is either polyvinylidene fluoride or a copolymer consisting mainly of vinylidene fluoride.

* * * * *